United States Patent [19]
Hall et al.

[11] Patent Number: 5,990,189
[45] Date of Patent: Nov. 23, 1999

[54] COATING COMPOSITIONS

[75] Inventors: Stephen Anthony Hall, Penarth; Nicholas Eric Ivory, Glastonbury, both of United Kingdom

[73] Assignee: Coates Brothers PLC, Kent, United Kingdom

[21] Appl. No.: 08/930,634

[22] PCT Filed: Apr. 4, 1996

[86] PCT No.: PCT/GB96/00861

§ 371 Date: Jan. 14, 1998

§ 102(e) Date: Jan. 14, 1998

[87] PCT Pub. No.: WO96/31806

PCT Pub. Date: Oct. 10, 1996

[30] Foreign Application Priority Data

Apr. 6, 1995 [GB] United Kingdom .................. 9507101

[51] Int. Cl.⁶ ............................. G03C 1/725; G03C 1/73; C08G 59/17; C08K 3/20
[52] U.S. Cl. ................................. 522/79; 522/80; 522/83; 522/84; 522/85; 522/100; 522/103; 430/281.1; 430/286.1; 528/365; 528/406; 428/209
[58] Field of Search ...................... 522/100, 103, 522/81, 83, 79, 84, 85; 430/281.1, 286.1; 528/365, 406; 428/209

[56] References Cited

U.S. PATENT DOCUMENTS

| | | | |
|---|---|---|---|
| 4,100,045 | 7/1978 | Bogan et al. | 204/159.16 |
| 4,714,751 | 12/1987 | Schornick et al. | 522/100 |
| 4,935,330 | 6/1990 | Hofmann et al. | 430/281 |

FOREIGN PATENT DOCUMENTS

| | | |
|---|---|---|
| 47-29477 | 11/1972 | Japan . |
| 89/07785 | 8/1989 | WIPO . |

*Primary Examiner*—Susan W. Berman
*Attorney, Agent, or Firm*—Ostrolenk, Faber, Gerb & Soffen, LLP

[57] ABSTRACT

A photopolymerizable material is provided that is suitable for use in the production of coatings or resists on printed circuit boards, for example The material is an ethylenically unsaturated polymerizable reaction product of a polyepoxide and a mixture of (i) a major proportion of an ethylenically unsaturated carboxylic acid and (ii) a minor. proportion of a saturated aliphatic or aromatic carboxylic acid, the reaction product being further modified by reaction with a dicarboxylic acid or anhydride thereof.

7 Claims, No Drawings

COATING COMPOSITIONS

This invention is concerned with improvements in and relating to coating compositions and more particularly is concerned with coating compositions for the production of photopolymerizable coatings upon substrates.

In order to provide for the attachment of electrical components to a printed circuit board of the type comprising a patterned layer of an electroconductive metal (generally copper) on an electrically non-conductive substrate (generally a plastics impregnated substrate) a patterned layer of a solder resist is applied to the board so as to expose parts of the patterned metal layer and the so-coated board is contacted with molten solder so that the solder adheres to the patterned metal layer at the exposed portions thereof. Generally, before the board is contacted with the solder, the electrical components are placed on the other side of the board (although, of course, not in the case of surface-mounted boards) with conducting elements extending therefrom passing through holes in the board into the exposed portions of the patterned metal layer.

U.S. Pat. No. 4,100,045 discloses a radiation-curable vehicle for coating and printing ink composition obtainable as the reaction product of a polyepoxide, a saturated dicarboxylic acid, an ethylenically unsaturated monocarboxylic acid, and optionally, a saturated monocarboxylic acid. These materials have low acid values and set-hard upon UV curing.

It has now been found that a patterned solder resist may be formed from a photopolymerizable composition comprising a modified epoxy resin, as hereinafter defined, by exposing a layer of such a composition to actinic radiation through a suitable transparent substrate bearing an opaque image, and subsequently, in a "development" step, removing unexposed composition with a solvent therefor, namely an aqueous alkaline solution, due to the high acid value of the material.

According to one embodiment of the invention, therefore, there is provided an ethylenically unsaturated polymerizable reaction product of a polyepoxide and a mixture of (i) a major proportion of an ethylenically unsaturated carboxylic acid and (ii) a minor proportion of a saturated aliphatic or aromatic carboxylic acid, further modified by a reaction with an anhydride of a dicarboxylic acid.

The invention also provides a coating composition, for the production of a photopolymerizable coating, comprising a modified reaction product as described above together with a photopolymerization initiator for the said polymerizable reaction product and a liquid carrier.

Preferably, the composition also contains an inert organic filler, the said filler and the said reaction product suitably being present in a ratio of from 5 to 25 parts by weight of filler to from 95 to 75 parts by weight of the modified reaction product.

The invention also provides a method of forming a photopolymerizable coating upon a substrate which comprises applying a coating of a coating composition as defined above to the substrate and allowing it to dry by evaporation of the liquid carrier.

The modified reaction product of polyepoxide and ethylenically unsaturated carboxylic acid, generally acrylic acid or methacrylic acid, is hereinafter simply referred to as the "modified epoxy acrylate". The modified epoxy acrylate should preferably be solid or semi-solid at ambient temperature, e.g. should preferably have a ring and ball softening point (determined according to British Standard Specification No. 4692 of 1971) of at least 30° C. preferably at least 60° C. The unmodified epoxy acrylate is one derived from. the reaction of a polyepoxide and a mixture of an ethylenically unsaturated carboxylic acid or reactive derivative thereof and a saturated aliphatic or aromatic carboxylic acid or reactive derivative thereof. The polyepoxide is preferably an aromatic polyepoxide. Aromatic polyepoxides are polyepoxides containing phenyl groups (polyphenyl polyepoxides) such as polyepoxides derived from the reaction of bisphenols, especially polynuclear bisphenols such as bisphenol-A, with epichlorohydrin, or epoxidised phenol or cresol novolacs, the latter being especially preferred. Aromatic polyepoxides are well known materials and are described, for example in "Chemistry of Organic Film Formers", Solomon D. H., 2nd Edition, Krieger Publishing, 1977, at pages 188, 189 and 192.

The polyepoxide is first reacted with a mixture of a major proportion of an ethylenically unsaturated carboxylic acid and a minor proportion of a saturated aliphatic or aromatic carboxylic acid. Suitably the mixture comprises from 65 to 90 mole % of unsaturated acid, preferably 75 to 85 mole % thereof; the balance being the saturated acid. Suitable unsaturated acids include monocarboxylic acids such as acrylic and methacrylic acids. Suitable saturated aliphatic acids include aliphatic monocarboxylic acids containing from 2 to 22 carbon atoms, preferably 4 to 16 carbon atoms, such as ethanoic, pentanoic, iso-butyric and stearic acids. Suitable saturated aromatic acids are acids containing from 7 to 9 carbon atoms, such as benzoic, methylbenzoic and ethylbenzoic acids. The use of such saturated acids has been found to improve the toughness and/or flexibility of the acid coating finally formed from the modified epoxy acrylates. The incorporation of a suitable saturated acid can improve both the flexibility of the coating and the drying window within which the solder resist can be processed. A further benefit which may be obtained is an increase of the exposure speed of these systems by incorporation of suitable saturated acids. The reason for this is not fully understood. The polyepoxide will generally be reacted with the mixture of acids in approximately stoichiometric amounts of carboxylic acid groups to epoxide groups. Thus, the ratio of carboxylic acid groups to epoxy groups is suitably from 0.95:1 to 1:1.

The unmodified epoxy acrylate is subsequently modified by reaction with an anhydride of a dicarboxylic acid, suitably to give a product having an acid value of from 30 to 130 mgKOH/g, preferably from 35 to 80 mgKOH/g. A wide variety of anhydrides may be employed to the purpose of modification and examples of these include succinic, didodecylsuccinic itaconic, citraconic, maleic, phthalic, hexahydrophthalic, tetrahydrophthalic, methylnadic and trimellitic anhydrides.

The photopolymerization initiator used in the compositions of the invention serves to induce polymerization of the epoxy acrylate when the composition, after application to a substrate, is subjected to actinic radiation. A wide variety of such photopolymerization initiators are known in the art, such as benzoin ethers and anthraquinone derivatives. Preferred initiators for use in the compositions of the invention are phenyl ketone initiators such as benzophenone, acetophone or Michlers ketone or mixtures thereof.

The initiator is suitably present in the composition in an amount of from 1 to 10% by weight, based on the weight of the epoxy acrylate.

The compositions of the invention also contain a liquid carrier. This may, for example, be an organic solvent for the modified epoxy acrylate, with the modified epoxy acrylate dissolved therein, and examples of such solvents include lower carboxylic acid ester of lower alcohols (e.g. isopropyl acetate), lower dialkyl ethers (such as diethyl ether), ketones (such as acetone or methyl ethyl ketone), or, preferably, hydroxyalkyl ethers such as glycol monoethyl ether and ethylene glycol monobutyl ether.

Alternatively the carrier may comprise water with the modified epoxy acrylate dispersed as a solid therein or an organic solvent solution of the modified epoxy resin emulsified therein. Such compositions are described, for example, in EP-A-0536272 and EP-A-0573426.

The amount of carrier present in a coating composition of the invention as applied to a substrate (e.g. a printed circuit board) will, to some extent, depend upon the nature of the method by which the composition is to be applied to the substrate. Thus, where the composition is to be applied to a substrate by, for example, a screen printing process, it may contain up to 30% by weight of carrier whereas if it is to be applied to the substrate by a curtain coating process it may contain up to 50% by weight of carrier. The compositions of the invention may conveniently be formulated containing a lower amount of carrier than is required in the actual application process, the additional carrier required being added to the composition to dilute it prior to the application process.

The filler, which will be in powdered or finely divided form, serves to improve the resistance of the composition, when used as a solder resist, to heat or thermal shock such as is experienced when the cured composition is brought into contact with molten solder. The filler should, when the coating composition is employed in the production of a solder resist, not be one which undergoes thermal decomposition when heated by contact with molten solder and examples of suitable fillers include blanc fixed, aluminium hydrate, china clay, calcium carbonate (coated or uncoated) and micronised talc, or mixtures thereof. The weight ratio of filler to modified epoxy acrylate is from 5–25:95–75, preferably from 10–20:90–80, more preferably from 15–20:85–80.

In general, in order to provide a generally tack-free coating from the composition (as is described below), it is preferable, when using less solid modified epoxy acrylates (i.e. those having lower softening temperatures), to employ higher levels of inorganic fillers, but, of course, within the broad range noted above.

The coating compositions of the invention also suitably contain a colorant, for example an organic pigment such as a chlorinated phthalocyanine pigment, in order that the application of the composition to a substrate provides a visible image. Suitably such colorants will be present in amounts of up to 5% by weight, based on the weight of epoxy acrylate, filler and initiator, preferably from 0.5–2% by weight thereof. The coating compositions of the invention may also contain antifoaming agents, such as silicone oils, in order to improve their application properties and such antifoaming agents may be present in amounts similar to those given above for the coloring agents.

Whilst the compositions of the invention contain the modified epoxy acrylate as principal photopolymerizable ingredient, other photopolymerizable materials may be present and examples of such include esters of mono- or polyhydric alcohols with ethylenically unsaturated carboxylic acids such as acrylic or methacrylic acid, and liquid epoxy acrylates. Such other photo-polymerizable materials are not, however, essential and when used it is preferred that they be employed in minor amounts as compared with the modified epoxy acrylate, e.g. in amounts of less than 25%, preferably less than 10%, of the weight of the modified epoxy acrylate.

A coating composition of the invention is used to form a photopolymerizable coating upon a substrate by applying it to the substrate by any convenient method, such as screen printing, curtain coating, roller coating or spray coating, and then allowing the applied coating to dry to a tack-free condition (i.e. to a condition such that it does not adhere to a surface with which it may come into contact) and generally this drying will be accelerated by heating the applied coating.

The resultant coating may be polymerized by exposure to actinic radiation, for example from a source such as a mercury vapour lamp.

As indicated above, a polymerizable coating obtained from a coating composition of the invention is particularly suitable for use in the production of a solder resist in a process for the manufacture of a printed circuit board. It should, however, be noted that such a polymerizable coating may also be used as to form a patterned etch or plating resist since the coating is acid and alkali resistant (it being possible to later wholly remove the coating by treatment with a hot dilute aqueous alkaline solution such as 5% aqueous sodium hydroxide solution, although such removal may not be necessary when the coating is used in the definition of inner layers in a multilayer construction since it is chemically compatible with adhesives used to bond multilayer constructions).

A further embodiment of the invention provides a method of forming a pattern of solder upon a layer of an electrically conductive metal supported on an electrically non-conductive substrate by providing the metal layer with a patterned resist coating, whereby portions of the metal layer are coated with the solder resist coating and other portions of the metal layer are not so coated, and contacting the metal layer provided with the solder resist coating with molten solder whereby solder adheres to the portions of the metal layer not coated with the solder resist coating, in which the solder resist coating is formed by polymerizing, by exposure to actinic radiation, a photopolymerizable coating obtained by applying a coating composition in accordance with the invention to the metal layer and allowing it to dry.

One such process comprises the steps of:

(a) providing a circuit board having a patterned layer of a conductive metal (hereinafter simply referred to as copper) with a coating of a coating composition of the invention, at least over the copper layer, for example by screen printing process, by a curtain coating process or by electrostatic spray deposition, in all cases the coating of the composition will extend over the whole of the surface of the board;

(b) allowing the coated composition to dry to a tack-free, i.e. by evaporation of volatile organic solvent therefrom.

(c) exposing the coated board to actinic radiation through a positive for the desired solder pattern (i.e. a transparency, generally a photographic transparency, having light transmitting portions corresponding to the non-solderable portion of the desired solder pattern and non-transmitting portions corresponding to the solderable portions of the desired solder pattern) to cure the exposed portions of the coating, i.e. to photopolymerize the photomerizable material therein;

(d) removing the non-exposed portions of the coating by means of aqueous alkaline solution (e.g. sodium carbonate solution); and (e) contacting the board having a patterned coating image with molten solder, e.g. in the form of a so-called "standing wave" of solder, to apply solder to the board in the desired pattern.

This process makes it possible to provide circuit boards with a patterned solder resist of high definition and accuracy since, in general, exposure through a positive to actinic radiation provides for good accuracy and definition which is of importance as the overall size of circuit boards, and hence the size of individual parts of the solder resist pattern, decrease, a tendency which as been noted recently. It is to be noted that in the above process, step (e) follows directly from step (d), that is there is no requirement for a heat-curing step after radiation curing. However, if desired such a heat-curing step may be employed.

In this case the composition applied to the board preferably also contains a thermal curing agent which will assist thermal curing of the modified epoxy acrylate. Suitable thermal curing agents include polyamines, polyamino resins, dicyandiamide, melamine derivatives and blocked isocyanurate materials. Bisphenol A or F resins and cresol or phenol-based epoxy novolaks can also be used as thermal curing agents. Where the composition applied to the board contains a thermal curing agent it is generally more convenient to put the system up as a two-part system, one part containing the modified epoxy acrylate and the other part containing the curing agent therefor. Suitable two-part systems, employing aqueous carriers are disclosed in WO 93/06350.

The circuit board having a patterned layer of copper thereon used as starting material in step (a) of the process described above may be produced in a number of ways, either by the so-called "subtractive" method or by the so-called "additive" method.

In the subtractive method a laminate comprising a layer of copper on a non-conducting substrate is first provided with a positive patterned image of an acid-resisting coating and the exposed copper is then etched away with a suitable acidic etchant, e.g. acid cupric chloride, the remaining copper then being exposed by removal of the acid-resisting coating. A coating of acid-resistant material may, as is well-known, be applied by a patterned coating method, such as a screen printing method, or by coating the copper with a layer of a photosensitive composition and subsequently exposing this to light through a positive or negative image of the desired copper layer, depending on whether the resist coating is a so-called positive or negative working resist and subsequently removing the developable (i.e. solvent-soluble) portions of the image with a suitable solvent.

The compositions of the invention are, themselves, perfectly suitable for use as negative working resists, i.e. resists the exposed portions of which are cured to give an insoluble coating. Thus, the circuit boards having a patterned layer of copper on the surface thereof may be provided by firstly coating a copper-clad substrate with a coating composition of the invention, allowing the coating to dry, exposing the dried coating to actinic radiation through a positive of the desired copper layer pattern to cure the portion of the coating exposed to radiation, removing the uncured portion of the coating with a solvent therefor and subsequently etching the coated board. The cured coating may then be removed by washing with a solvent therefor, e.g. aqueous sodium hydroxide solution. The board may then be provided with a patterned solder coating as described above.

In the additive method for the preparation of the board having a patterned layer of copper, a non-conductive substrate is first coated with an activating material for a so-called electroless copper plating solution, the board is then provided with a negative patterned image of a resist coating, and the board is then immersed in an electroless copper plating solution to form a layer of copper on the exposed portions of the board, i.e. those not covered with the resist. Here again the composition of the invention may be used to form the resist layer, for example by coating the activated board with a layer of the coating composition, allowing it to dry and exposing it to actinic radiation through an appropriate positive of the circuit pattern so that the exposed portion of the coating is photo hardened, the non-exposed portion subsequently being removed with a suitable solvent.

Whilst the compositions of the invention are photosensitive, they are not effectively sensitive to subdued light or light having a wavelength above 420 nanometers. Thus the initial application of the coating composition to a substrate can be carried out in the light (although of course not light having a high amount of actinic radiation).

In order that the invention may be well understood the following examples are given by way of illustration only. In the examples all parts are by weight unless otherwise stated.

EXAMPLE 1

A photoimageable resin was produced by reacting an epoxy cresol novolak resin (QUATREX 3410, Dow Chemicals) (40 parts) dissolved in propylene glycol diacetate (30.7 parts), with acrylic acid and benzoic acid (12 parts and 3 parts respectively) in the presence of hydroquinone (0.1 parts) and triphenyl phosphine (0.2). The resulting acrylated resin was then carboxylated with tetrahydrophthalic anhydride (14 parts). This photoreactive resin was then incorporated in the following photoimageable ink formula:

| Material | Parts |
| --- | --- |
| Photoimageable Resin | 58 |
| Tris (2-hydroxy ethyl) isocyanurate triacrylate | 3 |
| IRGACURE 903 (9) | 5 |
| QUANTACURE ITX (10) | 1 |
| Propylene glycol diacetate | 3 |
| Barium sulphate | 21 |
| Talc | 5 |
| Colour concentrate | 3 |
| BYK 055 (1) | 1 |

This formulation was printed on to the photocured resist layer using a 32 T mesh silk screen and dried at 90 C for 15 minutes to give a tack free finish. The resultant film was 30 microns thick. The resist layer was then photoimaged through a suitable art work at an exposure level of 400 mJoules/cm$^2$ and the desired pattern developed using 0.6% w/w sodium carbonate solution at 40° C. The resultant film showed good resolution of the phototool design and displayed good resistance to solder at 230° C.; once it had been given a further UV cure of 2000 mJoules/cm$^2$.

EXAMPLE 2

A photoimageable resin was produced as described above, but the acids reacted with the epoxy cresol novolak were acrylic acid (11 parts) and stearic acid (10 parts), the other proportions of constituents being altered accordingly. This resin was included in the following ink formulation.

| Material | Parts |
| --- | --- |
| Photoimageable Resin | 65 |
| IRGACURE 903 (9) | 7 |
| QUANTACURE ITX (10) | 1 |
| Pigment Concentrate (4) | 6 |
| Flow aid | 2 |
| Antifoam | 2 |
| Talc | 13 |
| Propylene Glycol Diacetate | 3 |
| Dicyandiamide | 3 |

A thermal curing agent for the above ink was produced my mixing the following ingredients:

| Material | Parts |
| --- | --- |
| Epoxy cresol novolak resin | 30 |
| Propylene glycol diacetate | 25 |
| Tris (2-hydroxy ethyl) isocyanurate triacrylate | 15 |
| Talc | 30 |

This thermal curing agent was mixed with the ink above in the ratio of 2 parts ink to 1 part thermal cure agent. The mixed ink was then printed through a 32 T silk screen and dried at 90° C. to produce a dry film thickness of 25 microns. This tack free film was exposed through suitable solder mask artwork and the unexposed areas developed away using a weak solution of sodium carbonate. The imaged film was then given a thermal bake at 150° C. for one hour to yield a fully cured film which was resistant to solder at 230° C. and showed good resolution of the original artwork pattern.

EXAMPLE 3

A photoimageable resin was produced by reacting an epoxy cresol novolac resin (EPICLON N-695 DaiNippon Inks & Chemicals) (42.8 parts) dissolved in propylene glycol methyl ether acetate (30 parts) with 3,5,5 trimethyl hexanoic acid (4.3 parts) and acrylic acid (12.8parts) in the presence of mono methyl ether hydroquinone (0.2parts) and triphenyl phosphine (0.2parts). The reaction was continued at 120° C. until the measured acid value was <5 mgKOH/g and the epoxy value was <9 mgKOH/g when the solution was cooled to 80° C. and maleic anhydride (9.7parts) was added. The product was then held at 80° C. for an acid value of 83 mgKOH/g. The photoactive material was then incorporated in the following photoimageable ink formulation:

| Material | Part |
| --- | --- |
| Photoimageable Resin | 57.90 |
| IRGACURE 907 (9) | 6.33 |
| QUANTACURE ITX (10) | 0.70 |
| BYK 035 (2) | 0.93 |
| Barium Sulphate | 20.67 |
| AEROSIL R374 (11) | 2.90 |
| Pigment Concentrate (4) | 1.57 |
| DOWANOL PGDA (14) | 9.00 |

A thermally curing component was prepared to mix with the above ink further improving the solder resists thermal stability and hardness.

| Material | Part |
| --- | --- |
| KAYARD K48H (5) | 50.3 |
| Melamine | 3.3 |
| AEROSIL R374 (11) | 0.5 |
| Barium Sulphate | 38.3 |
| Ethoxylated TMPA (15) | 7.6 |

The ink was mixed in a ratio of 2:1 with the thermally curing component and applied using a curtain coater to give a dry film thickness of 40–80 microns. Processing was then continued as in Example 3 to produce a heat resistant tack free film able to withstand soldering.

EXAMPLE 4

A photoimageable resin was prepared by reacting 1 equivalent of cresol epoxy novolac resin NPCN 704 (Nan Ya) with 0.85 equivalents of acrylic acid and 0.15 equivalents of neopentanoic acid followed by reaction of the acrylated resin with sufficient THPA to give an acid value of 85 mgKOH/g. The reaction was done at 70% none volatiles in ethyl 3-ethoxypropionate with 1000 ppm of hydroquinone as inhibitor with continuous air sparging to prevent gelation.

This photoreactive resin was then incorporated in the following photoimageable ink formulation that can be diluted with water.

| Material | Part |
| --- | --- |
| Photoimageable Resin | 54.00 |
| IRGACURE 907 (9) | 6.50 |
| QUANTACURE ITX (10) | 3.00 |
| MODAFLOW 2 (6) | 1.50 |
| Pigment dispersion (phthalocyanin green) | 3.00 |
| ACRYSOL RM8 (7) | 4.00 |
| ATLAS G1350 (8) | 1.50 |
| Distilled water | 21.50 |
| AEROSIL TS100 (13) | 5.00 |

An ink formulation was first prepared by mixing the resin, photoinitiators, flow aid and pigment dispersion with a Silverson high speed stirrer until a uniform product results. To this product RM8 and ATLAS g1350 and dispersed by low speed stirring until homogeneous then distilled water was added to give a stable emulsion, finally AEROSIL TS100 was then added to this emulsion to give a product suitable for screen printing.

The material produced above was then printed onto a IPC test printed circuit using 22 T mesh screen and then dried at 100° C. for 30 minutes, this film was then imagewise exposed through IPC test artwork. The image was then developed using 0.6% w/w aqueous sodium carbonate solution and baked for 1 hour at 150° C. A hard uniform film was produced with excellent adhesion that can withstand soldering at 230° C.

EXAMPLE 5 equivalent of cresol epoxy novolac resin EPICLON N-680 (Dai Nippon Inks and Chemicals) was reacted with 0.85 equivalents of acrylic acid and 0.15 equivalents of ethyl hexanoic acid. After completion of the reaction the resultant product was carboxylated with tetrahydrophthalic anhydride to give an acid value of 70 mgKOH/g. The reaction was done at 70% non-volatiles in toluene with 3000 ppm triphenyl phosphine as catalyst and 200 ppm hydroquinone with continuous air sparging throughout processing. At the completion of processing the toluene was removed by vacuum distillation to produce a product with B&R melting point of 90° C.

The photoimageable resin was then mixed in a heated extruder to the formulation shown below:

| Material | Part |
| --- | --- |
| Photoimageable Resin | 83.50 |
| IRGACURE 907 (9) | 7.90 |
| QUANTACURE ITX (10) | 3.10 |
| Benzoin | 1.50 |
| MODAFLOW 2 (6) | 3.00 |
| Phthalocyanin Green | 1.00 |

The solid material produced was then ground and classified to give a product with a particle size of less than 15 microns which was dispersed using a Silverson emulsification stirrer in the following formulation:

| Material | Part |
|---|---|
| Powder Resist | 40.00 |
| ACRYSOL RM8 (7) | 5.00 |
| Polyvinylpyrrolidone | 3.00 |
| Distilled Water | 52.00 |

The material produced a stable powder aqueous suspension that can be screen, spray or curtain coated onto an IPC solder resist test panel. The application viscosity can be altered in each case by dilution with distilled water. The film produced was dried at 90° C. for 30 minutes to produce a smooth, tack-free film. The film was then imaged through suitable art work and the image developed using 0.6% w/w sodium carbonate solution at 30–40° C. The film was then given a final bake for 1 hour at 150° C. to produce a coating with excellent adhesion to copper tracks and either epoxy or polyimide substrates. The film also had excellent solder and solvent resistance.

| Materials | |
|---|---|
| (1), (2) | Proprietory antifoams ex ByK Chemicals |
| (3) | Curing agent : mixture of dicyandiamide and N-methyl pyrrolidone |
| (4) | 25% suspension of phthalocyanine green in a polymer solution of epoxyacrylate |
| (5) | Epoxy novolac ex Nippon Kayaku |
| (6) | Acrylic polymer flow aid, ex Monsanto |
| (7) | Associative thickener, ex Rohm & Haas |
| (8) | surfactant |
| (9) | Photoinitiator, ex Ciba Geigy |
| (10) | Photoinitiator, ex Biosynthetics inc. |
| (11) | Amorphous silica, ex Degussa |
| (12) | Reactive monomer, ex Sartomer |
| (13) | A proprietory amorphous silica |
| (14) | A propylene glycol derivative solvent, ex Dow |
| (15) | Ethoxylated trimethyl propane triacrylate |
| (16) | An ethoxylated acrylic block copolymer surfactant |

In the light of this disclosure, modifications of the described examples, as well as other examples, all within the scope of the present invention as defined by the appended claims will now become apparent to persons skilled in this art.

We claim:

1. An ethylenically unsaturated material comprising:

an ethylenically unsaturated polymerizable reaction product of a polyepoxide and a mixture of:

(i) a major proportion of an ethylenically unsaturated carboxylic acid, and (ii) a minor proportion of a saturated material selected from the group consisting of aliphatic and aromatic carboxylic acids;

the reaction product being further modified by reaction with an anhydride of a dicarboxylic acid.

2. The material according to claim 1, wherein the ethylenically unsaturated carboxylic acid forms from 65 to 90% of the mixture with the saturated aliphatic or aromatic carboxylic acid.

3. The material according to claim 1, wherein the ratio of carboxylic acid groups to epoxy groups in the reaction product of polyepoxide and the mixture is from 0.95:1 to 1:1.

4. The material according to claim 1, wherein the dicarboxylic acid anhydride has an acid value of from 30 to 130 mgKOH/g.

5. A coating composition, for the production of a photopolymerizable coating, comprising an ethylenically unsaturated material according to claim 1, together with a photopolymerization initiator therefor and a liquid carrier.

6. The composition according to claim 5, further comprising an inert inorganic filler.

7. A method of forming a photopolymerizable coating upon a substrate which method comprises applying a coating of a coating composition according to claim 5, to the substrate and allowing it to dry by evaporation of the liquid carrier.

* * * * *